(12) United States Patent
Rayanakorn et al.

(10) Patent No.: US 7,639,078 B2
(45) Date of Patent: Dec. 29, 2009

(54) CLASS AB FOLDED-CASCODE AMPLIFIER HAVING CASCODE COMPENSATION

(75) Inventors: Surapap Rayanakorn, Chiang Mai (TH); Robert C. Dobkin, Monte Sereno, CA (US); Brendan J. Whelan, Discovery Bay, CA (US)

(73) Assignee: Linear Technology Corporation

( * ) Notice: Subject to any disclaimer, the term of this patent is extended or adjusted under 35 U.S.C. 154(b) by 8 days.

(21) Appl. No.: 12/174,102

(22) Filed: Jul. 16, 2008

(65) Prior Publication Data

US 2008/0272844 A1    Nov. 6, 2008

Related U.S. Application Data

(63) Continuation-in-part of application No. 11/493,654, filed on Jul. 27, 2006, now Pat. No. 7,414,473.

(51) Int. Cl.
*H03F 3/45* (2006.01)
(52) U.S. Cl. .................... 330/255; 330/257
(58) Field of Classification Search ............. 330/253, 330/255, 257, 260, 292
See application file for complete search history.

(56) References Cited

U.S. PATENT DOCUMENTS

| 5,731,739 | A | * | 3/1998 | Ho ............................ 330/253 |
| 6,654,058 | B1 | | 11/2003 | Hosier et al. |
| 7,187,235 | B2 | | 3/2007 | Moon |
| 7,253,685 | B2 | * | 8/2007 | Chung ....................... 330/255 |
| 7,362,173 | B1 | * | 4/2008 | Knausz ...................... 330/253 |
| 2005/0285676 | A1 | | 12/2005 | Jones |

| 2006/0066400 | A1 | 3/2006 | Kang et al. |
| 2006/0091955 | A1 | 5/2006 | Choi |

OTHER PUBLICATIONS

Bhupendra K. Ahuja, "An Improved Frequency Compensation Technique for CMOS Operational Amplifiers," IEEE Journal of Solid-State Circuits, Dec. 1983, pp. 629-633, vol. SC-18, No. 6.
David B. Ribner and Miles A. Copeland, "Design Techniques for Cascoded CMOS Op Amps with Improved PSRR and Common-Mode Input Range," IEEE Journal of Solid-State Circtuits, Dec. 1984, pp. 919-925, vol. SC-19, No. 6.
Paul J. Hurst, et al., "Miller Compensation Using Current Buffers in Fully Differential CMOS Two-Stage Operational Amplifiers," IEEE Transactions on Circuits and Systems—I: Regulator Papers, Feb. 2004, pp. 275-285, vol. 51, No. 2.
Libin Yao, et al., "Fast-Settling CMOS Two-Stage Operational Transconductance Amplifiers and Their Systematic Design," IEEE International Symposium on Circuits and Systems, 2002, pp. II-839-II-842, IEEE.

* cited by examiner

*Primary Examiner*—Robert Pascal
*Assistant Examiner*—Hieu P Nguyen
(74) *Attorney, Agent, or Firm*—McDermott Will & Emery LLP

(57) ABSTRACT

A class AB folded-cascode amplifier having improved gain-bandwidth product, comprises a differential input circuit including a differential transistor pair coupled to a source of tail current and responsive to a differential input signal for conducting a first current, a cascode circuit coupled to the differential input circuit for supplying a second current thereto, and a class AB output stage. A compensation circuit is configured for feeding back mutually complementary compensation signals from an output node to the differential input circuit. Another compensation circuit is configured for feeding back a signal from the output of the output stage to the input of the output stage.

15 Claims, 5 Drawing Sheets

US 7,639,078 B2

CLASS AB FOLDED-CASCODE AMPLIFIER HAVING CASCODE COMPENSATION

RELATED APPLICATION

This application is a continuation-in-part of application Ser. No. 11/493,654, filed Jul. 27, 2006, now U.S. Pat. No. 7,414,473 titled "Class AB Folded-Cascode Amplifier Having Cascode Compensation," the entire disclosure of which is incorporated herein by reference.

TECHNICAL FIELD

The disclosed subject matter is directed generally to the field of amplifiers, and more particularly to class AB folded-cascode amplifier topologies.

BACKGROUND

The folded-cascode amplifier is a widely used topology in analog circuits. Its advantage over other amplifier types is in increased input common-mode range that normally includes one of the supply rails. A class AB type amplifier is characterized in that each half conducts through more than a half cycle but less than a full cycle, and normally is implemented by a push-pull output transistor pair.

Shown in FIG. 1 is a circuit diagram of a class AB folded-cascode amplifier circuit 10 of a type known in the prior art, which comprises an input differential pair circuit 12, a cascode circuit 14 that includes cascode transistors M13, M14 and a load circuit comprising current mirror 16, and a class AB output stage 18 powered from supply lines V+, V−. Input circuit 12 is a differential transistor amplifier in the form of a differential input transistor pair M11, M12 having their gates receiving the input signal at $V_{INP}$ and $V_{INM}$ to be amplified, their drains connected to current sources $I_2$, $I_3$ and their sources connected commonly to a source of tail current $I_1$. Cascode transistors M13, M14 are connected to the input transistor pair M11, M12 and current sources 12, 13, and function as current buffers. A gate voltage $V_{B1}$ produced by a source of bias voltage (not shown) is used to bias cascode transistors M13, M14 such that differential input transistor pair M11, M12 remain in saturation over their common-mode range while at the same time the headroom requirement for current sources $I_2$, $I_3$ are satisfied and cascode transistors M13, M14 are biased into saturation.

Coupled to cascode transistors M13, M14 and comprising the load 16 of the input differential pair circuit 12, is a wide swing cascode current mirror 16 that consists of transistors M15-M18, configured as shown with an interconnection between the gate of M15 and drain of M17. The current mirror 16 alternatively could be configured as other than as a wide-swing cascode type shown by interconnecting the gate and drain only of M15.

Class AB output stage 18 comprises complementary driver transistors M2P, M2N, serially connected as shown, with common node at $V_{OUT}$ driving load $R_L$, $C_L$. The driver transistors M2P, M2N are controlled by a conventional class AB control circuit 19. A Miller compensation network comprising capacitors $C_{C1}$, $C_{C2}$ and $R_{N1}$, $R_{N2}$ between the drains and gates of M2P, M2N, is implemented in conventional form in the class AB topology described.

In the simple Miller compensation arrangement, the amplifier is stabilized through RC compensation networks which split the first and second poles of the uncompensated amplifier further apart. In more detail, the added capacitors $C_{C1}$, and $C_{C2}$ make the first pole occur at a lower frequency and the second pole occur at a higher frequency. The simple Miller compensation also creates a zero whose location can be tuned by nulling resistors $R_{N1}$, and $R_{N2}$.

However, a problem that arises with simple Miller compensation is in the feedforward path from node A and node B to the output node. Because in this configuration the noninverting signal can pass to the output node, degradation in the frequency response of the amplifier occurs. Specifically, Miller compensation capacitors $C_{C1}$, and $C_{C2}$ become feedforward paths for high-frequency signals and can lead to unstable operation. In addition, the size of the capacitors can be large, consuming large die area.

Although provision of nulling resistors $R_{N1}$, and $R_{N2}$ in the feedforward paths reduces the magnitude of the feedforward signal, the problem is only mitigated to a limited extent. As the size of the nulling resistors is increased, the introduced LHP zero moves closer to the crossover frequency, degrading gain margin.

Cascode compensation to improve the gain-bandwidth product of amplifiers by blocking the feedforward signal with a current buffer in the compensation path has been practiced, using an explicit (added) current buffer (see Ahuja, An Improved Frequency Compensation Technique for CMOS Operational Amplifiers, IEEE Journal of Solid State Circuits, Vol. SC-18, No 6, December 1983, pp 629-622) or embedded (existing) cascode transistor in the input stage 12 for Class A amplifiers (see Ribner and Copeland, IEEE Journal of Solid State Circuits, Vol. SC-19, No 6, December 1984, pp 919-925). Compensation of fully differential operational amplifiers is also presented and analyzed by Hurst et al., IEEE Transactions on Circuits and Systems—1: Regulator Papers, Vol. 51, No. 2, February 2004, pp. 275-285 and Yao et al., Fast-settling CMOS Two-stage Operational Transconductance Amplifiers and Their Systematic Design, IEEE International Symposium on Circuits and Systems, Vol. 2, pp. II-839—II-842, all incorporated herein by reference. These approaches, however, are not applicable to class AB amplifiers. It would be desirable to provide a class AB folded-cascode amplifier topology having improved gain-bandwidth performance.

SUMMARY OF THE DISCLOSURE

A class AB folded-cascode amplifier having improved gain-bandwidth product, comprises a differential input circuit including a differential transistor pair coupled to a source of tail current and responsive to a differential input signal for conducting a first current, a cascode circuit that may include a cascode current mirror coupled to the differential input circuit for supplying a second current thereto, and a class AB output stage. A compensation circuit coupled between the output stage and differential input circuit is configured for coupling mutually complementary compensation signals from the output stage to the differential input circuit. In accord with one embodiment, a signal is fed back without signal inversion from an output node to one side of the differential input circuit, and also with signal inversion which may be produced by another current mirror, from the output stage to the complementary side. In another embodiment, the output signal is fed back without inversion from the output node to each side of the differential input circuit. The class AB folded-cascode amplifier further includes another compensation circuit for feeding back a signal from the output of the output stage to the input of the output stage.

Additional advantages of the present subject matter will become readily apparent to those skilled in this art from the following detailed description, wherein only the preferred embodiments of the invention are shown and described, simply by way of illustration of the best mode contemplated of carrying out the invention. As will be realized, the described subject matter is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE EMBODIMENTS

Figure 1:
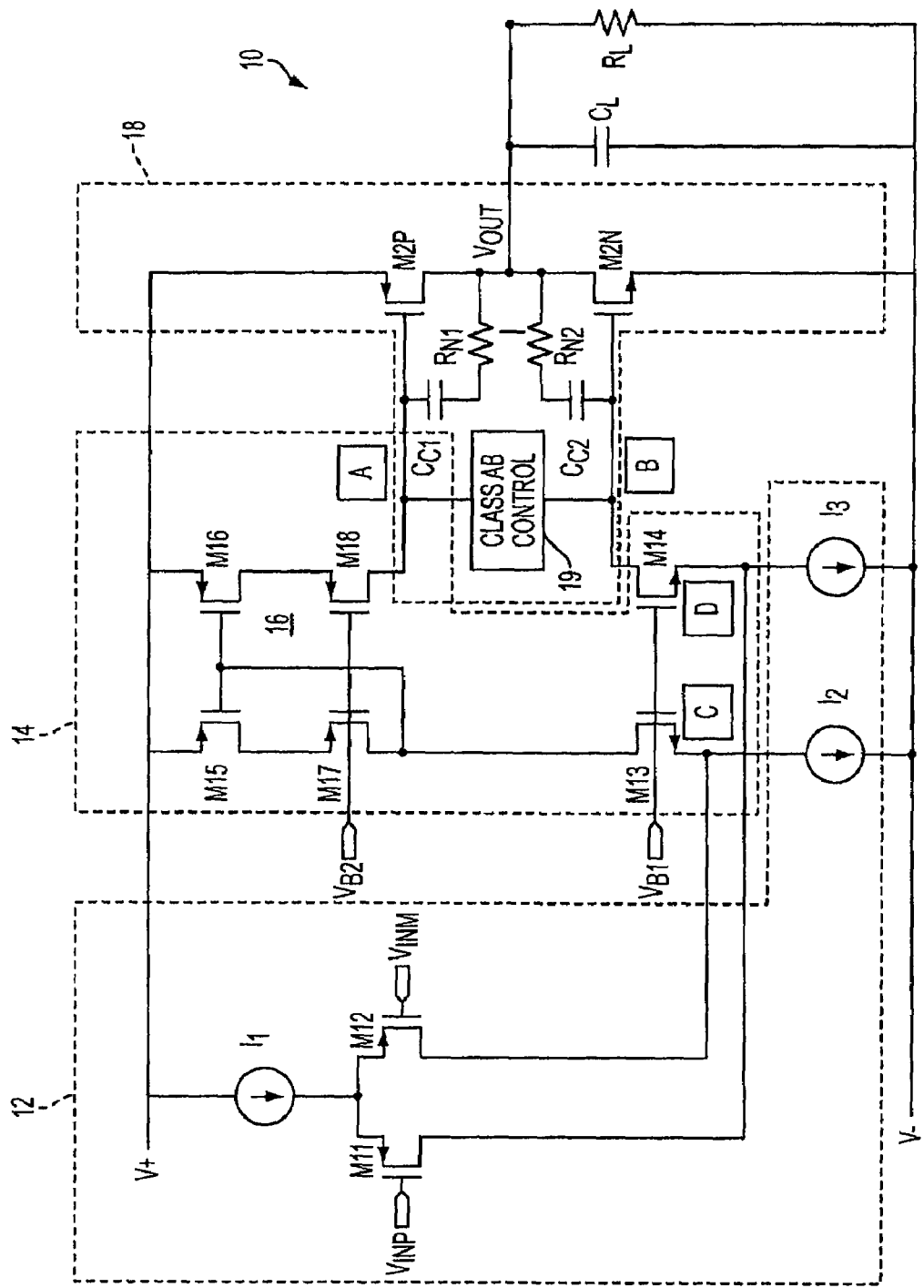
FIG. 1 is a circuit diagram of a class AB folded-cascode amplifier having conventional Miller compensation, in accord with the prior art.
Figure 2:
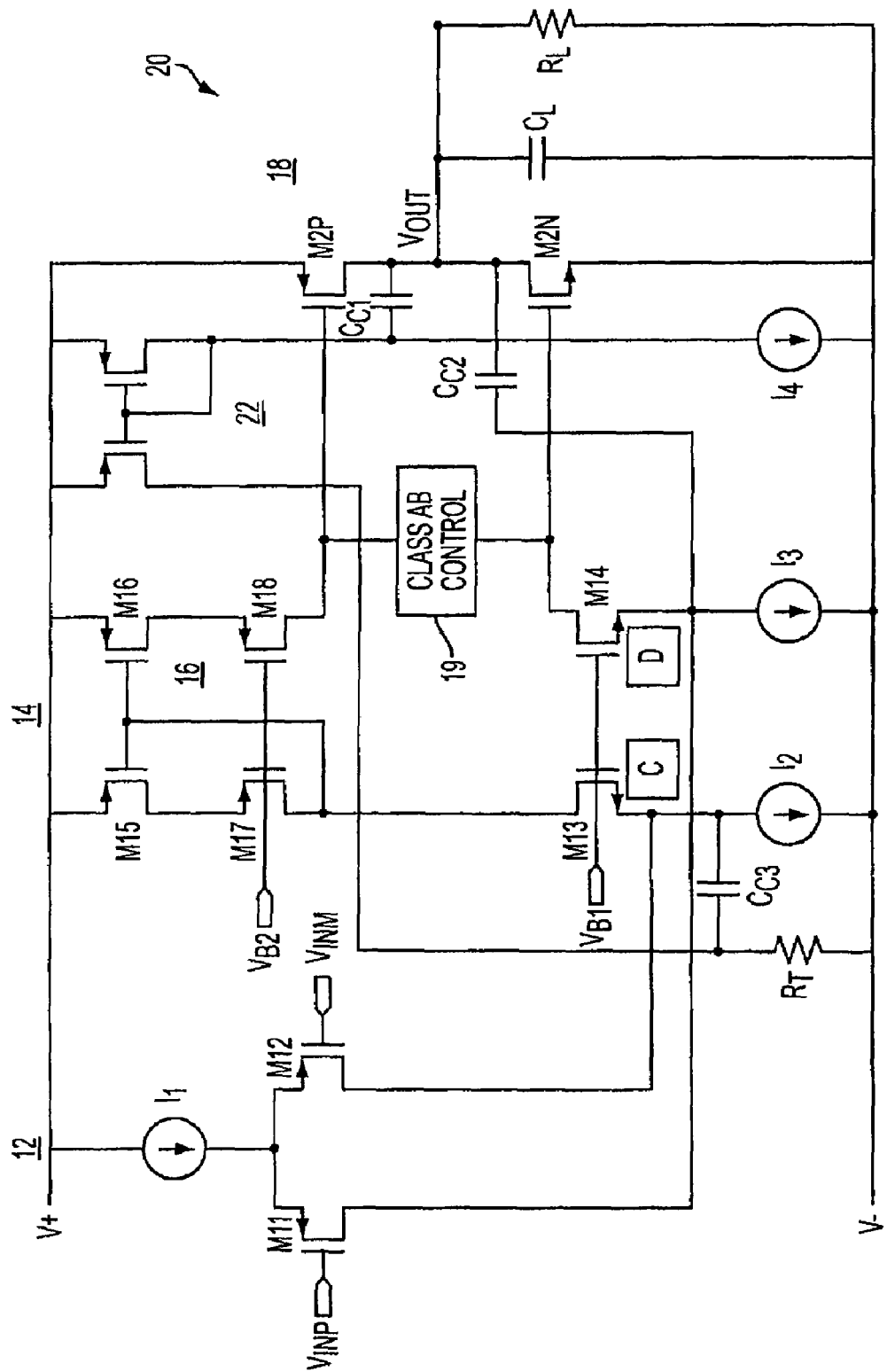
FIG. 2 shows a circuit diagram of a class AB folded-cascode amplifier, improved with embedded compensation in accord with one embodiment taught herein.

Referring to FIG. 2, class AB folded-cascode amplifier 20, other than in the manner by which it is compensated, is of topology that is the same as that of amplifier 10, FIG. 1, that is, one which comprises an input differential pair circuit 12, a cascode circuit 14 which includes transistors M13, M14 and a load circuit that includes current mirror 16, and a class AB output stage 18 and a control circuit 19, interconnected as shown (dotted blocks omitted for clarity of drawing). Whereas compensation of amplifier 10 is carried out in FIG. 1 by feedback between output node $V_{OUT}$ (or drains) and the gates of output transistors M2P, M2N as described previously, in accord with the current teachings, amplifier 20 of FIG. 2 implements novel feedback from the output node $V_{OUT}$ to differential input circuit 12 to carry out stable compensation of a class AB folded-cascode amplifier.

Some further background information now will be helpful. In an uncompensated amplifier, which has the topology of amplifier 10 in FIG. 1 but without components $C_{C1}$, $C_{C2}$ and $R_{N1}$, $R_{N2}$, compensation can theoretically be achieved by connecting a capacitor from the output node at $V_{OUT}$ to node D at the source of transistor M14 on one side of the differential input stage 12, resulting in a negative feedback to control the signal at the gate of output pair NMOS transistor M2N. However, the PMOS transistor M2P of the output pair cannot be compensated in the same way, that is, a capacitor cannot be connected from the output node to node C at the source of transistor M13 on the opposite side of the differential input stage 12. This is because, as the signals at nodes C and D are mutually complementary (180 degrees out of phase), this type of compensation connection would result in a destabilizing positive feedback in relation to output transistor M2P. However, in accord with FIG. 2, amplifier 20 implements cascode compensation for PMOS transistor M2P by inverting the feedback signal from the output node to be fed back to node C, so as to control the signal at the gate of output transistor M2P.

More specifically, signal compensation in amplifier 20 is implemented with symmetric embedded cascode compensation, that is, by a first feedback path which comprises a capacitor $C_{C2}$ coupled between the output node and node D at the source of transistor M14 of the input differential circuit 12, as before. However, capacitor $C_{C1}$ is coupled to node C through an inversion circuit 22, in the form of a current mirror in the exemplary embodiment shown.

The input to current mirror 22 is a signal of two components: a DC or quiescent component produced by current source $I_4$, and an AC component capacitively coupled from the output node. Only the AC component is coupled from the current mirror 22 to node C through an additional coupling capacitor $C_{C3}$ and resistor $R_T$ to ground.

Hence, because there is no positive feedback component, the topology described in accord with FIG. 2 achieves compensation of a class AB folded cascode amplifier without encountering instability that would otherwise arise by capacitive feedback directly from the output node to the complementary sides of the differential input circuit 12.

Although current mirror circuit 22 is implemented in the described embodiment for signal inversion of the feedback signal in relation to output transistor M2N, inversion can be implemented by other types of inversion circuitry.

Figure 3:
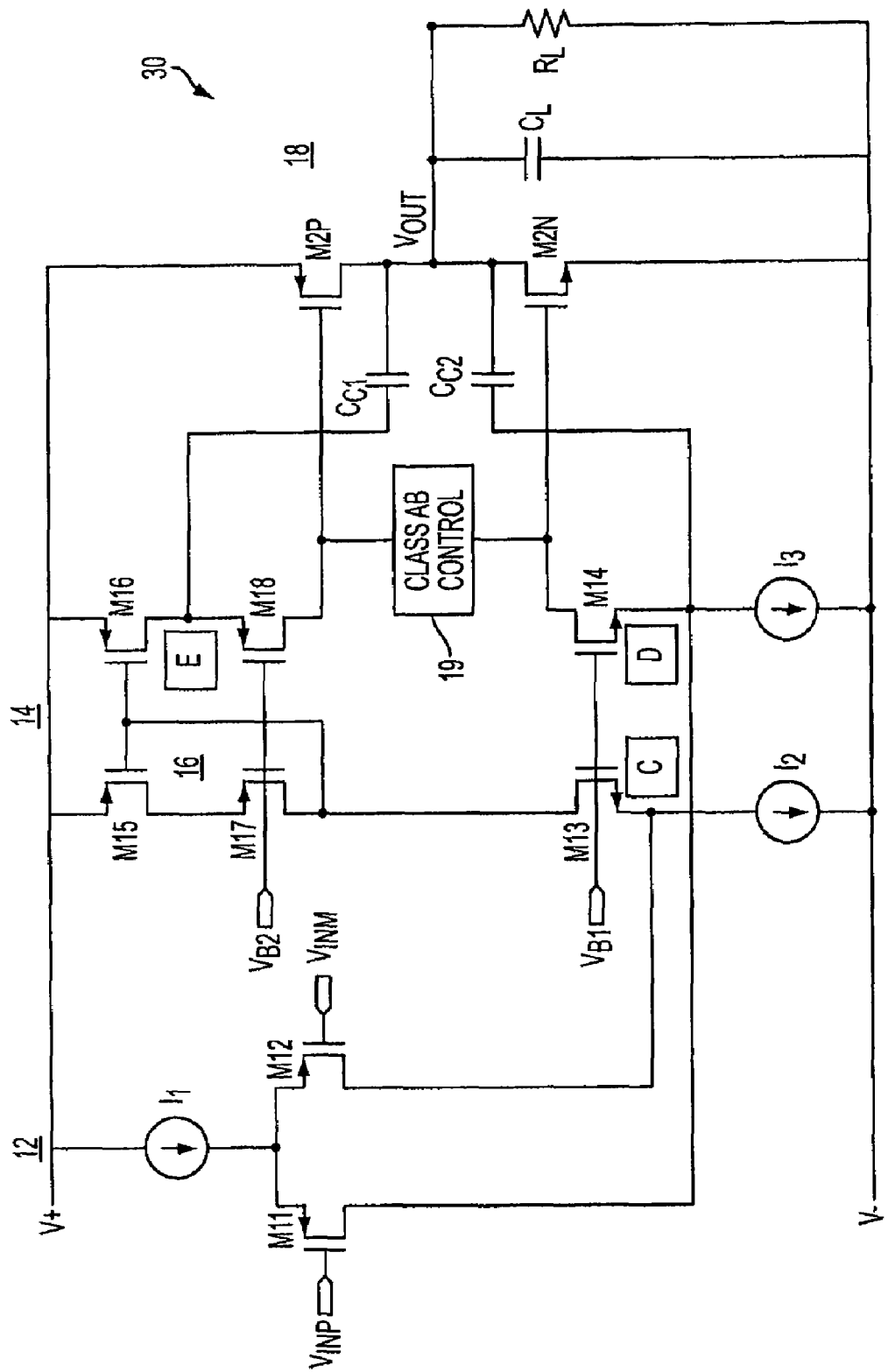
FIG. 3 shows a circuit diagram of a class AB folded-cascode amplifier, improved with embedded compensation in accord with another embodiment.

Whereas compensation carried out in the manner shown in FIG. 2 is effective, it requires the addition of an inversion circuit, that is, current mirror 22 in the example described, so that the current mirror 22 is in addition to, and external with respect to, cascode mirror 16. Another embodiment of compensation which implements inversion without the addition of inversion circuitry to the uncompensated amplifier is shown in FIG. 3. Referring to that figure, asymmetric embedded cascode compensation of amplifier 30 is realized by recognizing that the signal at node E in current mirror is in antiphase (180° out of phase) with the signal at node C and in phase with the signal at node D. By connecting compensation capacitor $C_{C1}$ from the output node to node E, cascode compensation is implemented for the PMOS output transistor M2P. As in the embodiment of FIG. 2, capacitor $C_{C2}$ is coupled between the output node and node D, directly, without signal inversion. The Table below shows gain-bandwidth product performance for three simulated amplifiers having compensation in accord with conventional Miller compensation and two disclosed embodiments, respectively. It is apparent from the Table that symmetric and asymmetric embedded cascode compensation, in accord with the teachings herein, produce considerably improved gain-bandwidth compared to simple Miller compensation in a class AB folded cascode amplifier of the type described.

TABLE I

| COMPENSATION SCHEMES | LOAD CONDITION: $C_L = 100$ pF, $R_L = 100$ kΩ | | LOAD CONDITION: $C_L = 500$ pF, $R_L = 100$ kΩ | |
| --- | --- | --- | --- | --- |
|  | GBW (kHz) | $\Phi_{M(°)}$ | GBW (kHz) | $\Phi_{M(°)}$ |
| SIMPLE MILLER COMPENSATION (SMC) | 339 | 60 | 204 | 31 |
| EMBODIMENT 1: SYMMETRIC EMBEDDED CASCODE COMPENSATION (SECC) | 556 | 61 | 354 | 30 |
| EMBODIMENT 2: ASYMMETRIC EMBEDDED CASCODE COMPENSATION (ASECC) | 538 | 61 | 428 | 31 |

Figure 4:
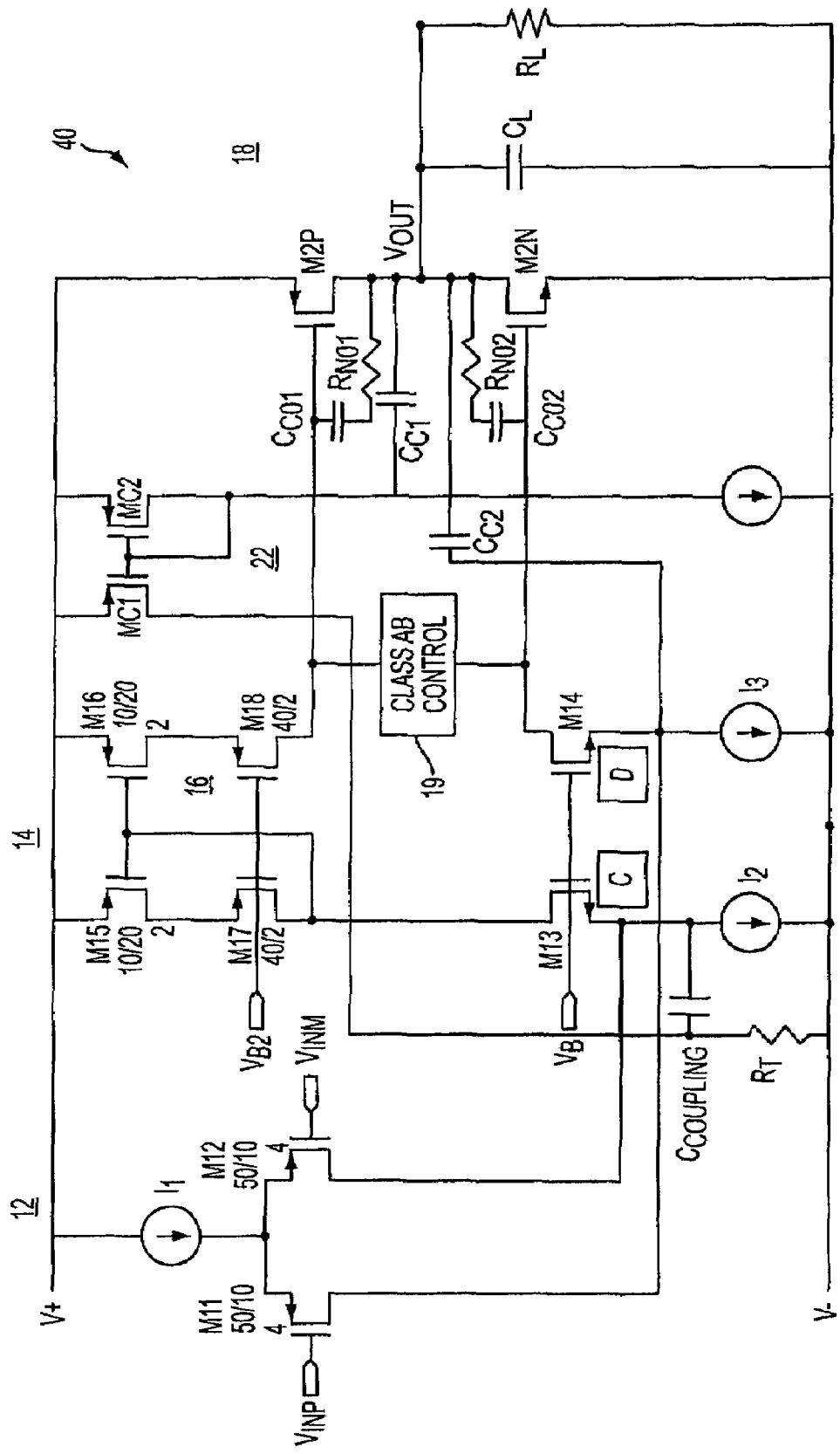
FIG. 4 shows a circuit diagram of a class AB folded-cascode amplifier, improved with embedded compensation in accord with one embodiment taught herein.

FIG. 4 shows a class AB folded-cascode amplifier 40 including two compensation networks. The first one is a Miller compensation network which may include a capacitor that is tied across an inverting gain element, such as the base to the collector in a common-emitter bipolar transistor or the drain to the gate in a common-source MOSFET. In FIG. 4, the Miller compensation network comprises a first network including a capacitor $C_{C01}$ and a resistor $R_{N01}$ coupled between the gate and the drain of PMOS transistor M2P, and a second network including a capacitor $C_{C02}$ and a resistor $R_{N02}$ coupled between the gate and the drain of NMOS transistor M2N. The second compensation network is the symmetric embedded cascode compensation as discussed with reference to FIG. 2.

Without the presence of the symmetric embedded cascode network, a noninverting signal can feedforward from the gates of transistors M2P and M2N to the output node, causing degradation in the frequency response of amplifier 40, as discussed in the background section.

The symmetric embedded cascode network has a significantly reduced feedforward as compared to the Miller compensation network, and less overall compensation is required in FIG. 4 than an amplifier with the Miller compensation alone. Accordingly, with the added symmetric embedded cascode network, the amount of compensation performed by Miller capacitors $C_{C01}$ and $C_{C02}$ may be reduced. This size change of $C_{C01}$ and $C_{C01}$ increases AC impedance of the feedforward path, reducing the amplitude of low frequency signals that are fed forward. Accordingly, the frequency range in which the amplifier is stable is extended.

In addition, the total capacitor value ($C_{C01}$, $C_{C02}$, $C_{C1}$, and $C_{C2}$) may be smaller than the Miller capacitors alone. A die area may thus be reduced.

On the other hand, although an amplifier having only a cascode compensation network may eliminate the problem of the degradation in the frequency response of the amplifier, the compensation network includes a delay in the cascode compensation path, especially for very low power amplifiers. This delay can cause output stage stability problems, especially with complicated class AB circuitry.

However, combining the Miller compensation and the cascode compensation as shown in FIG. 4 can minimize the delay in the feedback path by compromising between the feedforward path gain and the feedback path delay. This compromise can allow for a design that is more closely tuned for an anticipated application.

As a result, the various issues discussed above can be improved by amplifier 40. According to this embodiment, a unity gain bandwidth product and a slew rate of amplifier increase.

Figure 5:
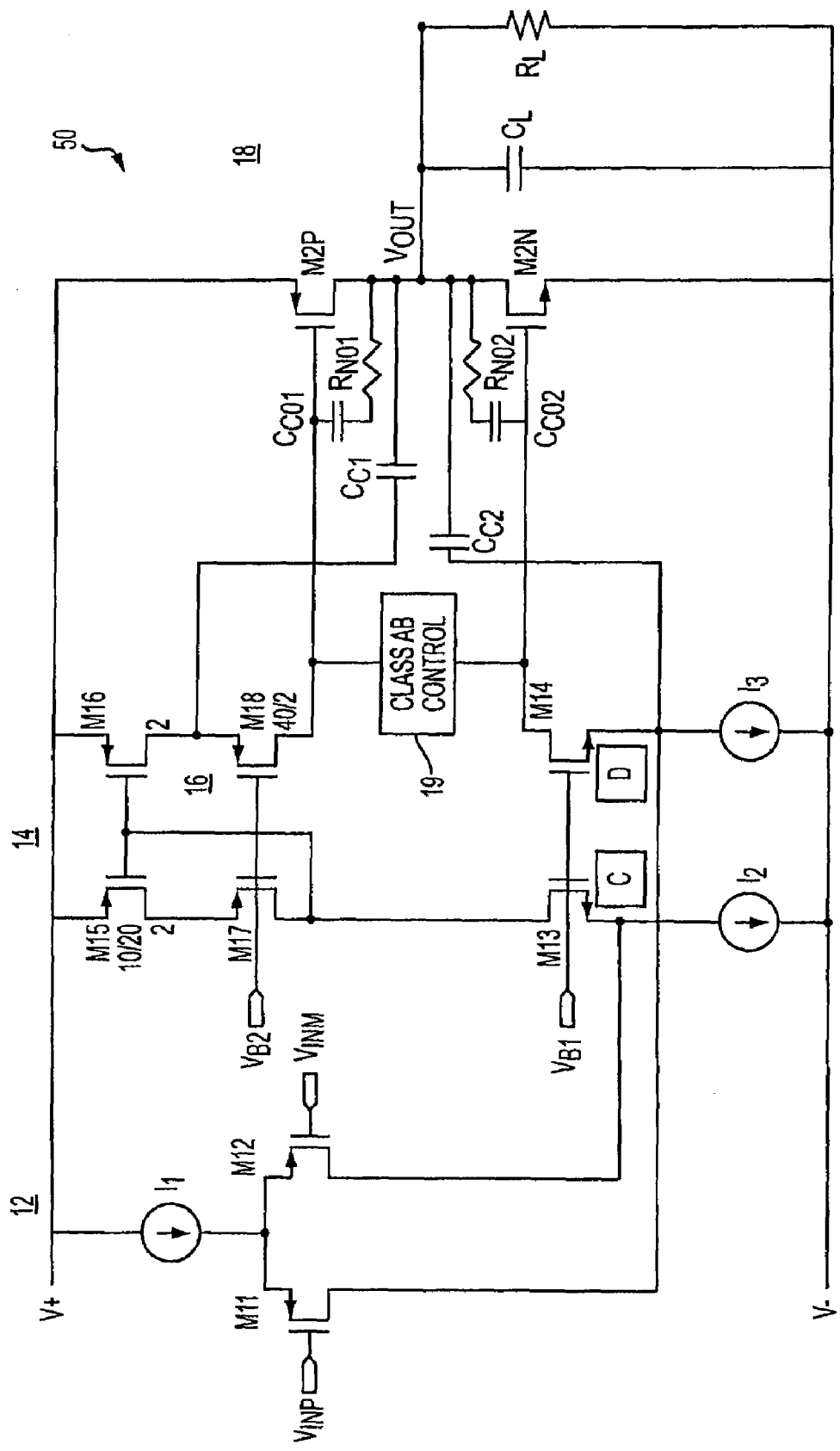
FIG. 5 shows a circuit diagram of a class AB folded-cascode amplifier, improved with embedded compensation in accord with one embodiment taught herein.

FIG. 5 shows another class AB folded-cascode amplifier 50 including two compensation networks. The first is a Miller compensation network which as described in reference to FIG. 4, may comprise a first network including a capacitor $C_{C01}$ and a resistor $R_{N01}$, coupled between the gate and the drain of PMOS transistor M2P, and a second network including a capacitor $C_{C02}$ and a resistor $R_{N02}$ coupled between the gate and the drain of NMOS transistor M2N. The second compensation network is the asymmetric embedded cascode compensation as discussed by reference to FIG. 3.

As discussed with reference to FIG. 4, amplifier 50 can also improve, among other things, the degradation problem in the frequency response of the amplifier and the delay problem in the cascode compensation path. In addition, the total capacitor value ($C_{C01}$, $C_{C02}$, $C_{C1}$, and $C_{C2}$) may be smaller than the Miller capacitors alone, thus reducing an die area.

In this disclosure there are shown and described only preferred embodiments of the invention and a few examples of its versatility. It is to be understood that the invention is capable of use in various other combinations and environments and is capable of changes or modifications within the scope of the inventive concept as expressed herein. For example, the current disclosure has particular applicability to integrated operation amplifiers, although not limited thereto.

What is claimed is:

1. A class AB folded-cascode amplifier having improved gain-bandwidth product, comprising:
    a differential input circuit including a differential transistor pair coupled to a source of tail current and responsive to a differential input signal for conducting a first current;
    a cascode circuit coupled to the differential input circuit for supplying a second current thereto;
    a class AB output stage;
    a first compensation circuit for feeding back a signal from the output of the output stage to the input of the output stage; and
    a second compensation circuit for feeding back mutually complementary compensation signals from the output stage to the differential input circuit.

2. The class AB folded-cascode amplifier as recited in claim 1, wherein the output stage comprises complementary transistors interconnected at an output node and configured to be driven in class AB mode of operation.

3. The class AB folded-cascode amplifier as recited in claim 2, wherein the cascode circuit includes a differential input circuit load comprising a current mirror.

4. The class AB folded-cascode amplifier as recited in claim 3, wherein the current mirror is a wide swing, cascode current mirror.

5. The class AB folded-cascode amplifier as recited in claim 3, wherein the cascode circuit further includes a current buffer connected between the current mirror and the differential input circuit.

6. The class AB folded-cascode amplifier as recited in claim 1, wherein the first compensation circuit capacitively couples the input and the output of the output stage.

7. The class AB folded-cascode amplifier as recited in claim 1, wherein the differential input circuit has mutually complementary sides, and a first feedback path without signal inversion from the output stage to one side of the differential input circuit, and a second feedback path with signal inversion from the output stage to the complementary side of the differential input circuit.

8. The class AB folded-cascode amplifier as recited in claim 7, wherein the cascode circuit includes a first current mirror, and the second feedback path includes a second current mirror for inverting the output signal.

9. The class AB folded-cascode amplifier as recited in claim 8, including a first capacitor for coupling from the output stage to the second current mirror and a second capacitor for coupling the inverted signal from the second current mirror to the complementary side of the differential input circuit.

10. The class AB folded-cascode amplifier as recited in claim 7, wherein the second feedback path includes a current mirror for inverting the output signal.

11. The class AB folded-cascode amplifier as recited in claim 7, wherein
    the output stage comprises complementary transistors interconnected at an output node and configured to be driven in class AB mode of operation, and
    the first compensation circuit comprising a first path including a first capacitor coupled between a control electrode of one of the complementary transistors and the output node, and a second path including a second capacitor coupled between a control electrode of another complementary transistor and the output node.

12. A method of compensating a class AB folded-cascode amplifier of a type having a differential input circuit including a differential transistor pair coupled to a source of tail current and responsive to a differential input signal for conducing a first current, a cascode circuit coupled to the differential input circuit for supplying a second current thereto, and a class AB output stage, the method comprising the steps of:

coupling an output signal from the output stage to the input of the output stage; and coupling mutually complementary signals from the output stage to the input differential circuit.

13. A method as recited in claim 12, wherein the cascode circuit includes a current mirror, and the step of coupling includes implementing the current mirror for inverting the compensation signal from the output stage.

14. A method as recited in claim 12, wherein the cascode circuit includes a current mirror, and the step of coupling includes implementing an inversion circuit external to the current mirror for inverting the compensation from the output stage.

15. A method as recited in claim 14, wherein the inversion circuit comprises an additional current mirror.

* * * * *